United States Patent
Wu et al.

(10) Patent No.: US 11,933,820 B2
(45) Date of Patent: Mar. 19, 2024

(54) CURRENT DETECTION SYSTEM, CURRENT DETECTION METHOD, AND DETECTION APPARATUS

(71) Applicant: Huawei Digital Power Technologies Co., Ltd., Shenzhen (CN)

(72) Inventors: Yonghua Wu, Dongguan (CN); Minxiang Zhang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 332 days.

(21) Appl. No.: 17/359,190

(22) Filed: Jun. 25, 2021

(65) Prior Publication Data

US 2021/0325433 A1 Oct. 21, 2021

Related U.S. Application Data

(63) Continuation of application No. PCT/CN2019/125163, filed on Dec. 13, 2019.

(30) Foreign Application Priority Data

Dec. 29, 2018 (CN) .......................... 201811647922.6

(51) Int. Cl.
 G01R 15/18 (2006.01)
 G01R 1/30 (2006.01)
 (Continued)

(52) U.S. Cl.
 CPC ............ G01R 15/181 (2013.01); G01R 1/30 (2013.01); G01R 19/25 (2013.01);
 (Continued)

(58) Field of Classification Search
 None
 See application file for complete search history.

(56) References Cited

U.S. PATENT DOCUMENTS

| 4,794,328 A | * | 12/1988 | Fernandes | ......... H02J 13/00034 374/E1.004 |
| 2008/0079418 A1 | * | 4/2008 | Rea | ...................... G01R 15/181 324/117 R |
| 2018/0174724 A1 | | 6/2018 | Gao et al. | |

FOREIGN PATENT DOCUMENTS

| CN | 101551416 A | 10/2009 |
| CN | 101552644 A | 10/2009 |

(Continued)

OTHER PUBLICATIONS

Decker et al., "Measurement of Two-Level Inverter Induced Current Slopes at High Switching Frequencies for Control and Identification Algorithms of Electrical Machines," The 2018 International Power Electronics Conference, pp. 2848-2853 (2018).

*Primary Examiner* — Vincent Q Nguyen
(74) *Attorney, Agent, or Firm* — Leydig, Voit & Mayer, Ltd.

(57) ABSTRACT

A current detection system, a current detection method, and a detection apparatus are provided. The current detection system includes a printed circuit board and N groups of amplification apparatuses, wherein N is a positive integer greater than or equal to 1. Each group includes at least one amplification apparatus. N Rogowski coils are mounted on the printed circuit board. The $n^{th}$ Rogowski coil is capable of being mounted concentric with the $n^{th}$ current-carrying conductor in N current-carrying conductors, which is perpendicular to a plane of the $n^{th}$ Rogowski coil. An output end of the $n^{th}$ Rogowski coil is connected to an input end of the first amplification apparatus in the $n^{th}$ group of the N groups of amplification apparatuses. The foregoing current detection system provides more convenience when being integrated into different electrical equipment, in particular when each group of amplification apparatus includes multiple amplification apparatuses.

13 Claims, 7 Drawing Sheets

(51) Int. Cl.
*G01R 19/25* (2006.01)
*H03F 3/45* (2006.01)
*H05K 1/18* (2006.01)

(52) U.S. Cl.
CPC ......... *H03F 3/45475* (2013.01); *H05K 1/181* (2013.01); *H05K 2201/1003* (2013.01); *H05K 2201/10151* (2013.01)

(56) References Cited

FOREIGN PATENT DOCUMENTS

| | | |
|---|---|---|
| CN | 203590195 U | 5/2014 |
| CN | 203672944 U | 6/2014 |
| CN | 204269715 U | 4/2015 |
| CN | 104730314 A | 6/2015 |
| CN | 204391499 U | 6/2015 |
| CN | 204439713 U | 7/2015 |
| CN | 106291079 A | 1/2017 |
| CN | 206020511 U | 3/2017 |
| CN | 206132836 U | 4/2017 |
| CN | 206546387 U | 10/2017 |
| CN | 109765422 A | 5/2019 |
| EP | 3296752 A1 | 3/2018 |
| JP | 2003090851 A | 3/2003 |
| JP | 4622839 B2 | 2/2011 |
| JP | 2014089079 A | 5/2014 |
| KR | 101476819 B1 | 12/2014 |
| WO | 2008077798 A1 | 7/2008 |

\* cited by examiner

CURRENT DETECTION SYSTEM, CURRENT DETECTION METHOD, AND DETECTION APPARATUS

CROSS-REFERENCE TO RELATED APPLICATIONS

This application is a continuation of International Application No. PCT/CN2019/125163, filed on Dec. 13, 2019, which claims priority to Chinese Patent Application No. 201811647922.6, filed on Dec. 29, 2018. The disclosures of the aforementioned applications are hereby incorporated by reference in their entireties.

TECHNICAL FIELD

Embodiments of this application relate to the field of circuits, and more specifically, to a current detection system, a current detection method, and a detection apparatus.

BACKGROUND

With the development of digitalization and intelligence, intelligence requirements of electrical equipment are increasingly high. Currently, a current detection function of the electrical equipment is basically implemented by using a current transformer (CT) and a meter. However, due to technical limitations, sizes of the CT and the meter are excessively large, and the CT and the meter are not suitable to be integrated into the electrical equipment.

SUMMARY

This application provides a current detection system, a current detection method, and a detection apparatus, to facilitate integration into electrical equipment.

According to a first aspect, an embodiment of this application provides a current detection system. The current detection system includes a printed circuit board and N groups of amplification apparatuses. Each of the N groups of amplification apparatuses includes at least one amplification apparatus, and N is a positive integer greater than or equal to 1. N Rogowski coils are mounted on the printed circuit board. The $n^{th}$ Rogowski coil in the N Rogowski coils is capable of being mounted concentric with the $n^{th}$ current-carrying conductor in N current-carrying conductors, and the $n^{th}$ current-carrying conductor is perpendicular to a plane of the $n^{th}$ Rogowski coil, n=1, ..., N. An output end of the $n^{th}$ Rogowski coil is connected to an input end of the first amplification apparatus in the $n^{th}$ group of amplification apparatus in the N groups of amplification apparatuses. It is convenient to integrate the foregoing current detection system into electrical equipment. In addition, if each group of amplification apparatus includes a plurality of amplification apparatuses, the current detection system may be used in different electrical equipment.

In a possible implementation of the first aspect, the $n^{th}$ Rogowski coil is configured to: detect current in the $n^{th}$ current-carrying conductor, and output a detection signal to the first amplification apparatus in the $n^{th}$ group of amplification apparatus through the output end of the $n^{th}$ Rogowski coil. The $n^{th}$ group of amplification apparatus is configured to amplify the detection signal obtained by the first amplification apparatus in the $n^{th}$ group of amplification apparatus.

In a possible implementation of the first aspect, the $n^{th}$ group of amplification apparatus includes a first amplification apparatus. The first amplification apparatus includes an amplifier circuit and an active inductance circuit, and an output end of the amplifier circuit is connected to an input end of the active inductance circuit. The foregoing current detection system may reduce direct current signals in signals output by the amplifier circuit, to alleviate impact of the direct current signals on the output signals.

In a possible implementation of the first aspect, the amplifier circuit is configured to: amplify an obtained input signal, and output a first output signal. The first output signal includes a first direct current signal and an amplified input signal, the first direct current signal is a direct current signal generated by the amplifier circuit, the input signal includes an alternating current signal, and the amplified input signal includes an amplified alternating current signal. The active inductance circuit is configured to: obtain the first output signal, perform direct current component suppression processing on the first output signal, and output a second output signal. The second output signal includes a second direct current signal and an amplified alternating current signal, the second direct current signal is a direct current signal generated by the active inductance current, and the second direct current signal is less than the first direct current signal.

In a possible implementation of the first aspect, the high-impedance amplifier circuit is a noninverting amplifier circuit.

In a possible implementation of the first aspect, the active inductance circuit is a low-consumption dual operational amplifier active inductance circuit.

In a possible implementation of the first aspect, at least one amplification apparatus in the $n^{th}$ group of amplification apparatus is the first amplification apparatus.

According to a second aspect, an embodiment of this application provides a current detection method, where the method includes: A detection apparatus obtains P pieces of amplification information, where the P pieces of amplification information are respectively amplification factors of P amplification apparatuses, P is a positive integer greater than or equal to 2, the detection apparatus is mounted in a target device, the current detection system according to the first aspect or any possible implementation of the first aspect is mounted in the target device, and the P amplification apparatuses are a group of amplification apparatuses in the current detection system. The detection apparatus determines a target port from P ports based on the P pieces of amplification information and reference information, where the P ports one-to-one correspond to the P amplification apparatuses, and the port is configured to output an output signal of the corresponding amplification apparatus. The detection apparatus determines a detection result corresponding to the target device based on a signal output through the target port. Based on the foregoing technical solution, the detection apparatus may automatically select a port of a signal that needs to be obtained. In this way, a same detection apparatus may be applied to different target devices.

In a possible implementation of the second aspect, before that the detection apparatus determines a detection result corresponding to the target device based on a signal output through the target port, the method further includes: The detection apparatus obtains detection related information, where the detection related information includes at least one of specification information of a printed circuit board in the current detection system, information about Rogowski coils in the current detection system, temperature drift information of operational amplifiers in the P amplification apparatuses, and temperature information of the printed circuit board. That the detection apparatus determines a detection result corresponding to the target device based on a signal output through the target port includes: The detection apparatus adjusts, based on the detection related information, the signal output through the target port, and determines the detection result corresponding to the target device. In this way, the detection apparatus may provide accuracy of the detection result by using the detection related information.

In a possible implementation of the second aspect, the reference information includes at least one of the following information: a rated current signal range of the target device, P output signals output through the P ports, and an optimal detection range of the detection apparatus.

In a possible implementation of the second aspect, the method further includes: The detection apparatus sends size information to an upper-layer management system, where the specification information is used to indicate a size of the printed circuit board in the current detection system.

According to a third aspect, an embodiment of this application provides a detection apparatus. The detection apparatus includes units configured to implement the method according to the second aspect or any possible implementation of the second aspect.

Optionally, the detection apparatus of the third aspect may be a chip, a circuit, or the like.

According to a fourth aspect, an embodiment of this application provides a storage medium. The storage medium stores instructions used to implement the method according to the second aspect or any possible implementation of the second aspect.

According to a fifth aspect, this application provides a computer program product including instructions. When the computer program product runs on a computer, the computer is enabled to perform the method according to the second aspect or any possible implementation of the second aspect.

DESCRIPTION OF EMBODIMENTS

Figure 1:
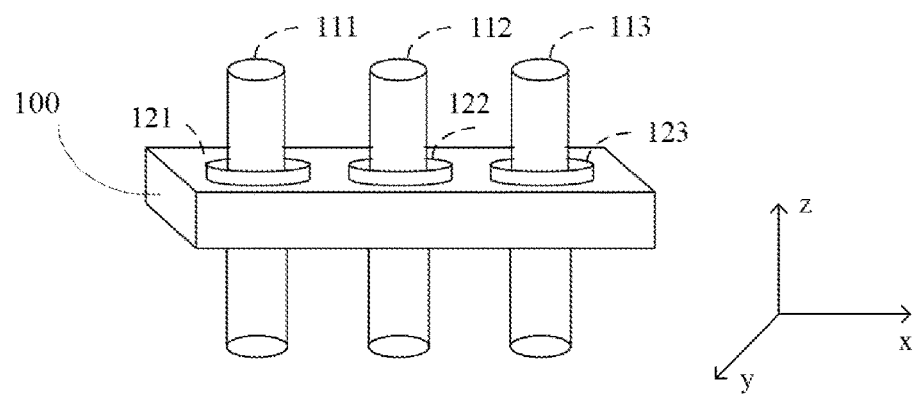
FIG. 1 is a schematic structural block diagram of a Rogowski coil and a current-carrying conductor according to an embodiment of this application.

The following describes technical solutions of this application with reference to accompanying drawings.

In this application, "at least one" means one or more, and "a plurality of" means two or more. The term "and/or" describes an association relationship for describing associated objects and represents that three relationships may exist. For example, A and/or B may represent the following three cases: Only A exists, both A and B exist, and only B exists, where A and B may be singular or plural. The character "/" generally indicates an "or" relationship between the associated objects. "At least one of the following items" or a similar expression thereof refers to any combination in these items, including any combination of a single item or a plurality of items. For example, at least one of a, b, and c may represent a, b, c, a-b, a-c, b-c, or a-b-c, where a, b, and c may be singular or plural. In addition, in the embodiments of this application, words such as "first" and "second" do not limit a quantity and an execution order.

It should be noted that, in this application, the word "an example" or "for example" is used to represent giving an example, an illustration, or a description. Any embodiment or design scheme described as an "an example" or "for example" in this application should not be explained as being more preferred or having more advantages than another embodiment or design scheme. Exactly, use of the word "an example", "for example", or the like is intended to present a relative concept in a specific manner.

To help a person skilled in the art better understand the technical solutions of this application, some basic concepts in the embodiments of this application are first described.

A Rogowski coil may also be referred to as a current-measuring coil, a derivative current sensor, or the like, and is a toroidal coil uniformly wound on a non-ferromagnetic material. An output signal is a derivative of current with respect to time. An output voltage signal passes through an integration circuit, so that input current can be truly restored.

There is a relationship between a quality factor and a size of a current inductive element. A smaller size of the inductive element indicates a lower quality factor of the inductive element. For example, a quality factor Q value of the inductive element is generally between 10 and 1000, and if a size of the inductive element is reduced to one tenth of the original size, the quality factor Q value of the inductive element is reduced to 0.1 to 10. In actual application, such a low quality factor value does not satisfy a requirement. Therefore, it is difficult for the current inductive element to ensure a usable quality factor value while ensuring size reduction. With an increasing demand for circuit miniaturization and portability, disadvantages of the inductive element become increasingly obvious. To resolve this problem, an active equivalent circuit is used in the industry to implement functions of the inductive element. The active circuit that can implement an inductive function may become an active inductance circuit. Compared with a conventional passive inductive element, the active inductance circuit is easier to integrate and has better stability. Therefore, the active inductance circuit may be used to further reduce a size of the circuit while ensuring precision of the circuit.

The embodiments of this application provide a current detection system, including: a printed circuit board (PCB) and N groups of amplification apparatuses, where each of the N groups of amplification apparatuses includes at least one amplification apparatus, and N is a positive integer greater than or equal to 1. N Rogowski coils are mounted on the printed circuit board. The $n^{th}$ Rogowski coil in the N Rogowski coils is capable of being mounted concentric with the $n^{th}$ current-carrying conductor in N current-carrying conductors, and the $n^{th}$ current-carrying conductor is perpendicular to a plane of the $n^{th}$ Rogowski coil, n=1, . . . , N. An output end of the $n^{th}$ Rogowski coil is connected to an input end of the first amplification apparatus in the $n^{th}$ group of amplification apparatus in the N groups of amplification apparatuses.

For example, the $n^{th}$ Rogowski coil may include a first output end and a second output end. The first amplification apparatus in the $n^{th}$ group of amplification apparatus in the N groups of amplification apparatuses includes a first input end and a second input end. The first output end is connected to the first input end, and the second output end is connected to the second input end.

If a group of amplification apparatus includes a plurality of amplification apparatuses, the plurality of amplification apparatuses are connected in series.

Optionally, in some embodiments, the N Rogowski coils may be fixedly disposed on the printed circuit board. In this case, the Rogowski coil may also be referred to as a PCB Rogowski coil.

Optionally, in some other embodiments, the N Rogowski coils may alternatively be detachably mounted on the printed circuit board.

FIG. 1 is a schematic structural block diagram of a Rogowski coil and a current-carrying conductor according to an embodiment of this application. In FIG. 1, three current-carrying conductors and three Rogowski coils are included in total, which are respectively a current-carrying conductor 121, a current-carrying conductor 122, and a current-carrying conductor 123, a Rogowski coil 111, a Rogowski coil 112, and a Rogowski coil 113.

The three Rogowski coils one-to-one correspond to the three current-carrying conductors. More specifically, the Rogowski coil 111 corresponds to the current-carrying conductor 121, the Rogowski coil 112 corresponds to the current-carrying conductor 122, and the Rogowski coil 113 corresponds to the current-carrying conductor 113. The current-carrying conductors are mounted concentric with the Rogowski coils. More specifically, a corresponding group of Rogowski coil and current-carrying conductor are mounted concentric with each other. As shown in FIG. 1, the current-carrying conductor 121 is mounted concentric with the Rogowski coil 111, the current-carrying conductor 122 is mounted concentric with the Rogowski coil 112, and the current-carrying conductor 123 is mounted concentric with the Rogowski coil 113. In addition, the current-carrying conductor is perpendicular to a plane of the corresponding Rogowski coil. As shown in FIG. 1, the current-carrying conductor 121 is perpendicular to a plane of the Rogowski coil 111, the current-carrying conductor 122 is perpendicular to a plane of the Rogowski coil 112, and the current-carrying conductor 123 is perpendicular to a plane of the Rogowski coil 113.

Concentric mounting means that a center of the current-carrying conductor overlaps a center of the Rogowski coil. For example, in the embodiment shown in FIG. 1, cross sections of the current-carrying conductor 111, the current-carrying conductor 112, and the current-carrying conductor 113 are all circular, and cross sections of centers of the Rogowski coils are also circular. The cross section herein is a cross section lying in a xy plane. Circle centers of the two circles (namely, the center of the Rogowski coil and the cross section of the current-carrying conductor) are the same. Alternatively, in other words, a projection of the cross section of the current-carrying conductor along a z direction and a projection of the cross section of the Rogowski coil along the z direction are concentric circles. Certainly, during actual implementation, there may be an error between the center of the cross section of the current-carrying conductor and the center of the cross section of the Rogowski coil. In other words, during actual implementation, the center of the cross section of the current-carrying conductor may not completely overlap the center of the Rogowski coil.

In addition, the Rogowski coils 111, 112, 113 shown in FIG. 1 are regularly disposed on the printed circuit board 100 (for example, disposed in a row shown in the figure). In some other embodiments, the Rogowski coils may be irregularly disposed on the printed circuit board.

In addition, the current-carrying conductor shown in FIG. 1 is a cylinder with a same diameter from top to bottom. Optionally, in some other embodiments, the current-carrying conductor may alternatively be of another shape. For example, the current-carrying conductor may be a cuboid. Optionally, in some other embodiments, the current-carrying conductor may alternatively be an irregular solid figure. The current-carrying conductor may be divided into two or more regular solid figures. For example, the current-carrying conductor may include two cylinders with different radiuses of cross sections. In another example, a part of the current-carrying conductor is a cylinder, and the other part may be a solid figure whose cross section is a regular polygon.

Figure 11:
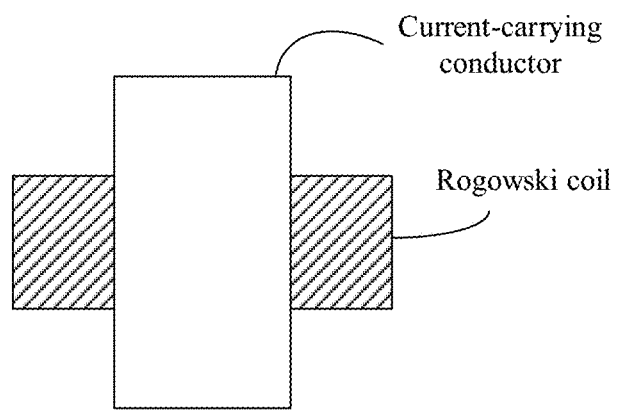
FIG. 11 is a schematic cross-sectional structural diagram of a current-carrying conductor and a Rogowski coil.
Figure 12:
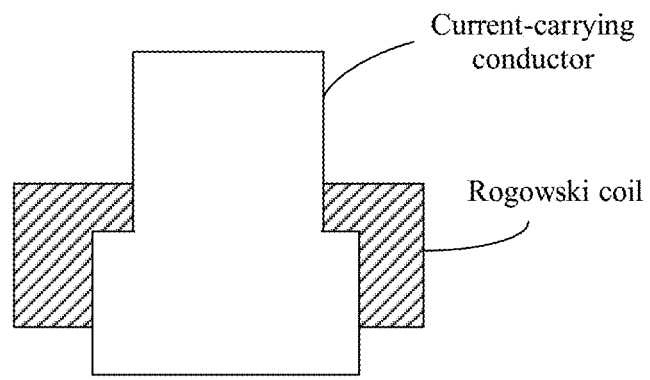
FIG. 12 is a schematic cross-sectional structural diagram of another current-carrying conductor and a Rogowski coil.

The Rogowski coil has a height h in a z-axis direction. Therefore, in some embodiments, one of the two or more solid figures runs through the Rogowski coil. Certainly, in some other embodiments, two or all solid figures may run through the Rogowski coil. For example, FIG. 11 is a schematic cross-sectional structural diagram of a different current-carrying conductor and a Rogowski coil. FIG. 12 is a schematic cross-sectional structural diagram of another different current-carrying conductor and a Rogowski coil.

Optionally, in some embodiments, centers of cross sections of the two or more solid figures that constitute the current-carrying conductor all overlap the center of the cross section of the Rogowski coil. Optionally, in some other embodiments, only a center of a cross section that is of the current-carrying conductor and that runs through the Rogowski coil may overlap the center of the cross section of the Rogowski coil.

In addition, the center of the Rogowski coil shown in FIG. 1 is circular. The center of the Rogowski coil may alternatively be of another shape, for example, a square, a rectangle, or the like.

The $n^{th}$ Rogowski coil is configured to: detect current in the $n^{th}$ current-carrying conductor, and output a detection signal to the first amplification apparatus in the $n^{th}$ group of amplification apparatus through the first output end and the second output end. The $n^{th}$ group of amplification apparatus is configured to amplify the detection signal obtained by the first amplification apparatus in the $n^{th}$ group of amplification apparatus.

FIG. 1 is still used as an example. The Rogowski coil 111 is configured to detect current in the current-carrying conductor 121, the Rogowski coil 112 is configured to detect current in the current-carrying conductor 122, and the Rogowski coil 113 is configured to detect current in the current-carrying conductor 113.

Figure 2:
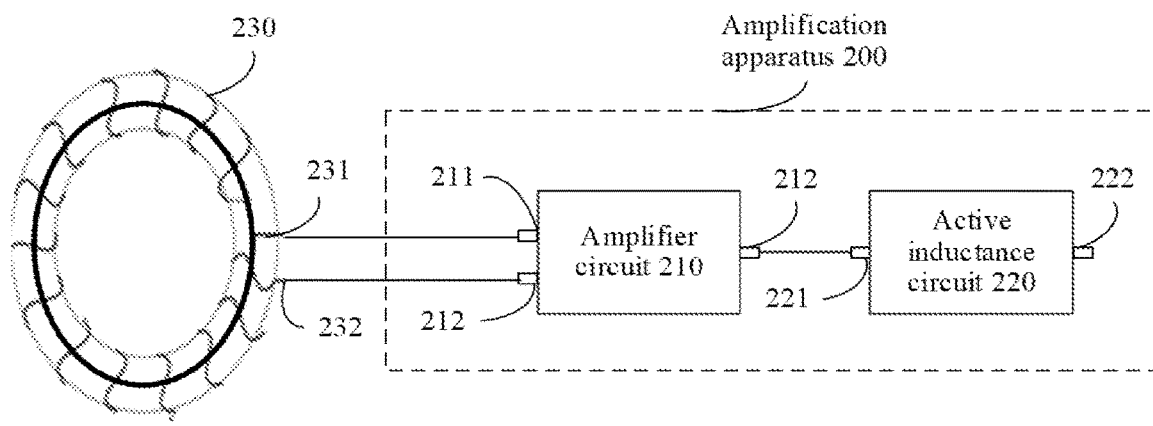
FIG. 2 is a schematic diagram of a Rogowski coil and an amplification apparatus.

FIG. 2 is a schematic diagram of a Rogowski coil and an amplification apparatus.

The amplification apparatus 200 shown in FIG. 2 includes an amplifier circuit 210 and an active inductance circuit 220. The amplifier circuit 210 includes an input end 211, an input end 212, and an output end 213. The active inductance circuit 220 includes an input end 221 and an output end 222. As shown in FIG. 2, the output end 213 of the amplifier circuit 210 is connected to the input end 211 of the active inductance circuit.

As shown in FIG. 2, the Rogowski coil 230 includes an output end 231 and an output end 232. The output end 231 is connected to the input end 211, and the output end 232 is connected to the input end 212.

For ease of description, the amplification apparatus including the amplifier circuit and the active inductance circuit shown in FIG. 2 is referred to as a first amplification apparatus in the following.

The amplifier circuit is configured to: amplify an input signal obtained by the first input end and the second input end, and output a first output signal through the first output end.

Optionally, in some embodiments, the input signal obtained by the amplifier circuit may include only an alternating current signal. For example, it is assumed that the amplifier circuit is connected to an output end of the Rogowski coil. The Rogowski coil is configured to detect an alternating current signal in a current-carrying conductor. The output end of the Rogowski coil outputs a derivative signal of the alternating current signal. The derivative signal of the alternating current signal is the input signal.

Optionally, in some other embodiments, the input signal obtained by the amplifier circuit may include an alternating current signal and a direct current signal. For example, the first amplification apparatus may be any amplification apparatus other than the first amplification apparatus in a group of amplification apparatuses. It is assumed that the amplification apparatus is the second amplification apparatus in a group of amplification apparatuses, and a previous-level amplification apparatus of the amplification apparatus is the first amplification apparatus. In this case, the input signal obtained by the amplification apparatus not only includes an alternating current signal that is generated by the Rogowski coil and that is amplified by a previous-level amplifier circuit, but also includes a direct current signal generated by an active inductance circuit of the previous-level amplifier circuit.

The first output signal may include an amplified input signal and a first output signal. The first output signal is a direct current signal generated by the amplifier circuit. For example, the first direct current signal may be a direct current signal obtained by amplifying a direct current bias signal generated by an operational amplifier in the amplifier circuit. For example, it is assumed that an amplification factor of the amplifier circuit is K, and a value of K is greater than 1. The direct current bias signal generated by an input end of the operational amplifier in the amplifier circuit is $V_{off1}$, and the input signal is $V_{in}$. The first output signal $V_{out}$ output through the output end of the amplifier circuit satisfies the following formula:

$$V_{out}=K\times(V_{off1}+V_{in})=K\times V_{off1}+K\times V_{in}.$$

$K\times V_{off1}$ is the first direct current signal generated by the amplifier circuit, and $K\times V_{in}$ is the amplified input signal.

As described above, the input signal obtained by the amplifier circuit may include only the alternating current signal, or may include the alternating current signal and the direct current signal. Therefore, the amplified input signal may include the amplified alternating current signal, and the amplified direct current signal.

The output end of the amplifier circuit may be connected to the input end of the active inductance circuit. For example, the first output end of the amplifier circuit may be connected to a third input end of the active inductance circuit. The active inductance circuit may obtain, through the third input end, the first output signal output by the amplifier circuit through the first output end. The active inductance circuit is configured to: perform direct current component suppression processing on the obtained first output signal, and output a second output signal. The second output signal includes a second direct current signal and an amplified alternating current signal. The second direct current signal is a direct current signal generated by the active inductance circuit itself. The second direct current signal is less than the first direct current signal.

As described above, in some cases, the amplified input signal in the first output signal may include only the amplified alternating current signal. In this case, the active inductance circuit may suppress the direct current signal generated by the amplifier circuit, to obtain the amplified alternating current signal.

In some other cases, the amplified input signal in the first output signal includes the amplified alternating current signal and the amplified direct current signal (the direct current signal is generated by the active inductance circuit in the previous-level amplification apparatus or other interference). In this case, the active inductance circuit may not only suppress the direct current signal generated by the amplifier circuit, but also suppress the direct current signal generated by the previous-level amplification apparatus or the other interference.

In the technical solutions of this application, a direct current component in an input signal may be reduced or even eliminated by using characteristics of inductance. The direct current signal herein (for example, the first direct current signal or the second direct current signal) is a direct current component in a voltage signal. The first output signal, the second output signal, the input signal, and the amplified input signal may be direct current voltage signals. Optionally, unless otherwise described, signals (for example, an output signal and an input signal) in the embodiments of this application are all voltage signals. Therefore, proper circuit elements are selected to constitute the active inductance circuit, so that a signal output by the active inductance circuit no longer includes an input direct current signal.

A direct current signal may also be generated in the active inductance circuit. For example, the active inductance circuit may include one or more operational amplifiers. The operational amplifier may generate a direct current bias component. Therefore, the second output signal output by the active inductance circuit may further include the second direct current signal.

The active inductance circuit in the first amplification apparatus may also include an output port connected to a detection apparatus. The detection apparatus may obtain, through the output port, the output signal, namely, the second output signal, obtained after the active inductance circuit performs direct current component suppression processing on the input signal.

Figure 3:
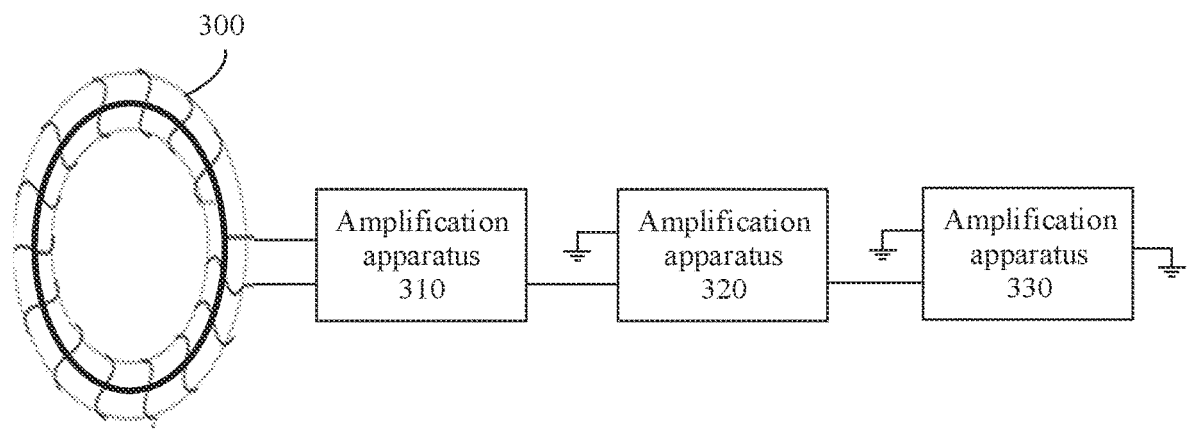
FIG. 3 is a schematic diagram of a connection between a Rogowski coil and a plurality of amplification apparatuses.

As described above, there may be a plurality of amplification apparatuses connected to the Rogowski coil. For example, FIG. 3 is a schematic diagram of a connection between a Rogowski coil and a plurality of amplification apparatuses. As shown in FIG. 3, there are three amplification apparatuses connected to the Rogowski coil 300. The three amplification apparatuses are respectively an amplification apparatus 310, an amplification apparatus 320, and an amplification apparatus 330.

An input end of the amplification apparatus 310 is connected to an output end of the Rogowski coil 300. An output end of the amplification apparatus 310 is connected to an input end of the amplification apparatus 320. The other input end of the amplification apparatus 320 is grounded. An output end of the amplification apparatus 320 is connected to an input end of the amplification apparatus 330. The other input end of the amplification apparatus 330 is grounded. An output end of the amplification apparatus 330 is grounded. The amplification apparatus 310, the amplification apparatus 320, and the amplification apparatus 330 may be collectively referred to as an amplification group. In other words, the Rogowski coil 300 is connected to an amplification group. The amplification group includes the amplification apparatus 310, the amplification apparatus 320, and the amplification apparatus 330.

It is assumed that a signal output by the Rogowski coil is $V_1$. In other words, an input signal of the amplification group is $V_1$. Assuming that an amplification factor of the amplification apparatus 310 is $K_1$, an amplification factor of the amplification apparatus 320 is $K_2$, and an amplification factor of the amplification apparatus 330 is K3, an amplified input signal that is finally output by the amplification apparatus 330 is $K_1 \times K_2 \times K_3 \times V_1$. Assuming that a direct current bias signal generated by the amplification apparatus 310 on the input end of the amplification apparatus 310 is $V_{off1}$, the direct current bias signal is also amplified by the three amplification apparatuses. A signal amplified by the three amplification apparatuses is $K_1 \times K_2 \times K_3 \times V_{off1}$. Assuming that a direct current bias signal generated by the amplification apparatus 320 on the input end of the amplification apparatus 320 is $V_{off2}$, the direct current bias signal is also amplified by the amplification apparatus 320 and the amplification apparatus 330. An amplified signal is $K_2 \times K_3 \times V_{off2}$. Assuming that a direct current bias signal generated by the amplification apparatus 330 on the input end of the amplification apparatus 330 is $V_{off3}$, the direct current bias signal is also amplified by the amplification apparatus 330. An amplified signal is $K_3 \times V_{off3}$. If none of the amplification apparatus 310, amplification apparatus 320, and amplification apparatus 330 shown in FIG. 3 includes an active inductance circuit, a final output signal $V_{out}$ satisfies the following formula:

$$V_{out} = K_1 \times K_2 \times K_3 \times V_1 + K_1 \times K_2 \times K_3 \times V_{off1} + K_2 \times K_3 \times V_{off2} + K_3 \times V_{off3} \quad \text{(formula 1.1)}$$

It can be learned from formula 1.1 that, in the final output signal, the amplified input signal is $K_1 \times K_2 \times K_3 \times V_1$, and a magnitude of an interference signal generated by the amplification apparatuses is $K_1 \times K_2 \times K_3 \times V_{off1} + K_2 \times K_3 \times V_{off2} + K_3 \times V_{off3}$.

The signal generated by the Rogowski coil is an inductive signal for a current-carrying conductor. Therefore, a magnitude of the signal generated by the Rogowski coil may be very small. For example, the magnitude of the input signal generated by the Rogowski coil may be between several mVs and a dozen or so mVs, and a magnitude of the direct current bias signal may also be several mVs. Therefore, after an amplification apparatus performs amplification, a proportion of the direct current bias signal in an output signal may be very large, affecting a detection result. The circuit shown in FIG. 3 is still used as an example. It is assumed that K1, K2, and K3 are all 10, the magnitude of the input signal is 16 mV, and magnitudes of $V_{off1}$, $V_{off2}$, and $V_{off3}$ are all 8 mV. Then, finally, the amplified input signal is 16000 mV, and the amplified direct current bias signal is 8880 mV. In view of this, the proportion of the direct current bias signal in the output signal is relatively large, which imposes a relatively large effect on the detection result. For example, the direct current signal easily causes saturation of an integral element, and a large direct current component increases a design difficulty of a next-level integration restoration circuit.

It is assumed that the amplification apparatus 310, the amplification apparatus 320, and the amplification apparatus 330 are all the amplification apparatuses shown in FIG. 2, namely, are all the first amplification apparatuses, and the active inductance circuit in the first amplification apparatus eliminates the direct current bias signal generated by the amplifier circuit. Even the active inductance circuit also generates a direct current bias signal, the direct current bias signal generated by the active inductance circuit is eliminated by an active inductance circuit in a next-level first amplification apparatus. Finally, the output signal may include only the direct current bias signal generated by the active inductance circuit in the amplification apparatus 330. Assuming that the direct current bias signal generated by the active inductance circuit is 8 mV, the amplified input signal included in the final output signal is 16000 mV, and the direct current bias signal included in the final output signal is 8 mV. In view of this, the proportion of the direct current bias signal in the output signal is greatly reduced. Therefore, impact of the direct current bias signal on the output signal can be effectively alleviated by using characteristics of inductance. For example, impact of an excessively high direct current component formed by a large amplification factor on integration restoration of a normal alternating current component of the output signal is effectively alleviated.

Optionally, in some cases, in a plurality of amplification apparatuses of an amplification group, only the last amplification apparatus may be the first amplification apparatus. In this way, direct current bias signals generated by previous-level amplification apparatuses may also be eliminated from the final output signal.

Optionally, in some cases, each of the plurality of amplification apparatuses in the amplification group may be the first amplification apparatus. In this way, the signal output by each amplification apparatus may include only the amplified input signal and the direct current bias signal generated by the active inductance circuit.

Each of the plurality of amplification apparatuses may have a port configured to connect to a detection apparatus. The detection apparatus may obtain, through the port, a signal amplified by the amplification apparatus. If the amplification apparatus is the first amplification apparatus, the port configured to connect to the detection apparatus outputs a signal obtain after the active inductance circuit performs direct current component suppression processing.

The circuit shown in FIG. 3 is still used as an example. It is still assumed that K1, K2, and K3 are all 10, the magnitude of the input signal is 16 mV, and the magnitudes of $V_{off1}$, $V_{off2}$, and $V_{off3}$ are all 8 mV. In addition, it is assumed that the direct current bias signal generated by the active inductance circuit in each amplification apparatus is 8 mV. Then, the output signal of the amplification apparatus 310 includes the 160 mV amplified input signal and the 8 mV direct current bias signal, the output signal of the amplification apparatus 320 includes the 1600 mV amplified input signal and the 8 mV direct current bias signal, and the output signal of the amplification apparatus 330 includes the 16000 mV amplified input signal and the 8 mV direct current bias signal. If only the last amplification apparatus (namely, the amplification apparatus 330) in the amplification apparatuses shown in FIG. 3 includes the active inductance circuit, the output signal of the amplification apparatus 330 includes the 16000 mV amplified input signal and the 8 mV direct current bias signal, the output signal of the amplification apparatus 310 includes the 160 mV amplified input signal and the 80 mV amplified direct current bias signal, and the output signal of the amplification apparatus 320 includes the 1600 mV amplified input signal and the 880 mV amplified direct current bias signal. In view of this, the direct current bias signal output by each amplification apparatus can be reduced by using the active inductance circuit. In addition, the active inductance circuit performs integral processing on an input signal (the input signal herein is a signal obtained by an input end of the active inductance circuit). As described above, the output signal generated by the Rogowski coil is a derivative signal, and the active inductance circuit performs integral processing on the input signal. Therefore, the output signal generated by using the active inductance circuit is a restored signal. Specifically, a derivative voltage signal functions on two ends of an ideal inductor equivalent to the active inductance circuit. A current signal in the inductor performs integration restoration on a derivative signal of an input voltage on the two ends of the inductor. By detecting current equivalently flowing through the equivalent active inductance circuit or a voltage in a linear relationship with a circuit, an integration circuit does not need to be additionally added. Therefore, an integration circuit configured to restore a derivative signal does not need to be disposed in a subsequent processing apparatus.

The current detection system in the embodiments of this application may be mounted in an apparatus that needs to perform current detection. For example, a device that needs to perform current detection may be a circuit breaker in a power distribution frame, or a switch in another weak-current device or strong-current device.

A circuit breaker is used as an example. The circuit breaker may be a pluggable circuit breaker. The pluggable circuit breaker may include a movable part and a fixed part. The movable part and the fixed part may implement pluggability by using a connector.

Optionally, in some embodiments, the current detection system may be located in the movable part.

Optionally, in some embodiments, the movable part includes N first connectors, the fixed part includes N second connectors, and the N first connectors one-to-one correspond to the N second connectors. The movable part and the fixed part implement pluggability by using the N first connectors and the N second connectors. For example, the first connector is a male connector, the second connector is set to a female connector, and pluggability is implemented by using one first connector that is a male connector and one second connector that is a female connector. Certainly, in some other cases, the first connector may alternatively be a female connector and the second connector may be a male connector.

The N first connectors include the N current-carrying conductors. In other words, the $n^{th}$ first connector in the N first connectors includes the $n^{th}$ current-carrying conductor in the N current-carrying conductors. For example, the first connector is a hollow apparatus, and the first connector does not affect current detection by a Rogowski coil on the current-carrying conductor. For example, the first connector may be made of an insulating material. The corresponding current-carrying conductor may run through a center of the first connector. For example, the first connector is a hollow cylinder, and the current-carrying conductor is a cylinder. A cross section of the current-carrying conductor is less than or equal to a hollow part of the first connector. In another example, the first connector itself may be a current-carrying conductor.

Optionally, in some other embodiments, the printed circuit board may also be located in the fixed part. The N second connectors of the fixed part include the N current-carrying conductors. In other words, the $n^{th}$ second connector in the N second connectors includes the $n^{th}$ current-carrying conductor in the N current-carrying conductors. For example, the second connector is a hollow apparatus, and the second connector does not affect current detection by a Rogowski coil on a current-carrying conductor. For example, the second connector may be made of an insulating material. The corresponding current-carrying conductor may run through a center of the second connector. For example, the second connector is a hollow cylinder, and the current-carrying conductor is a cylinder. A cross section of the current-carrying conductor is less than or equal to a hollow part of the second connector. In another example, the second connector itself may be two current-carrying conductors.

Figure 13:
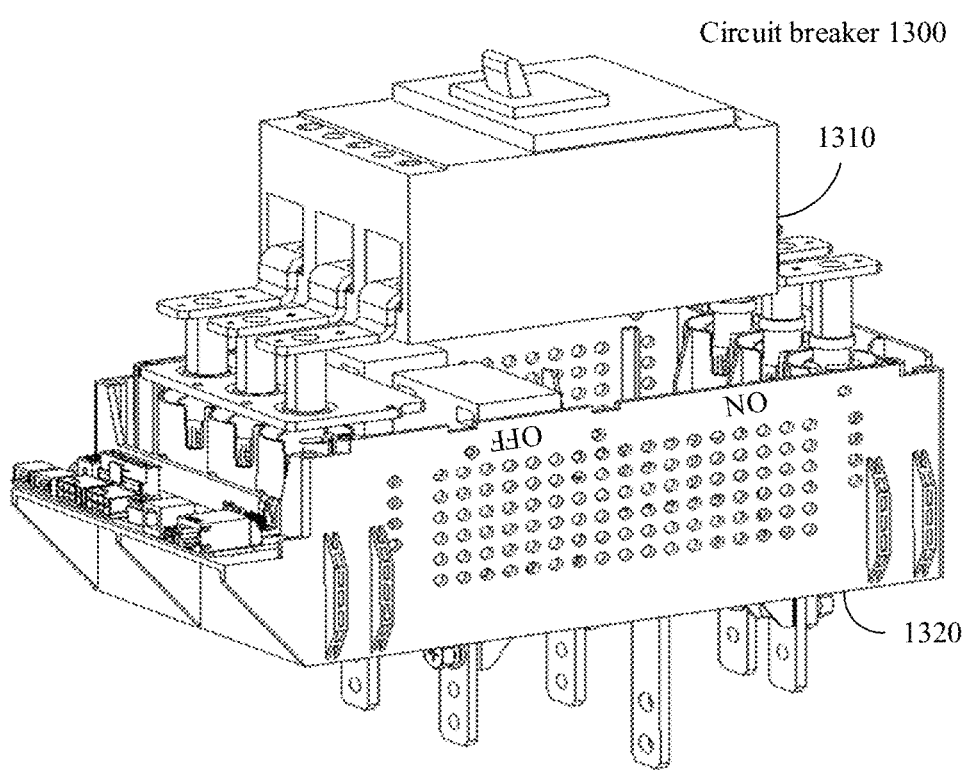
FIG. 13 shows a circuit breaker.

For example, FIG. 13 shows a circuit breaker. The circuit breaker 1300 shown in FIG. 13 includes a movable part 1310 and a fixed part 1320.

Figure 14:
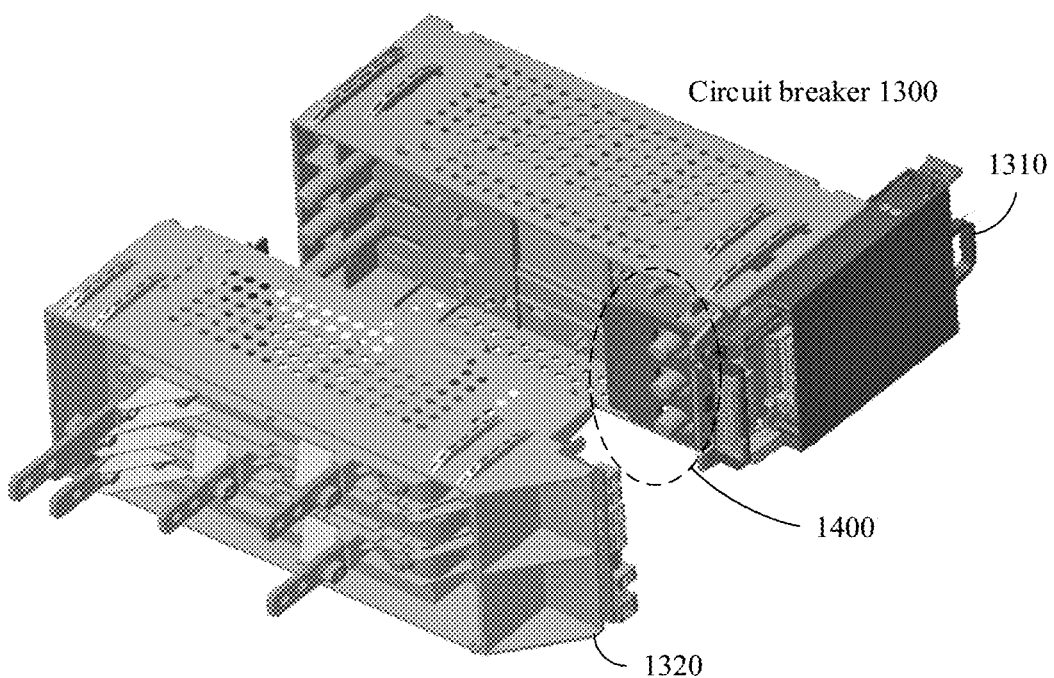
FIG. 14 shows a circuit breaker and a current detection system located in the circuit breaker.

FIG. 14 shows the circuit breaker and a current detection system located in the circuit breaker. As shown in FIG. 14, the current detection system 1400 is located in the movable part 1310 of the circuit breaker 1300.

Figure 4:
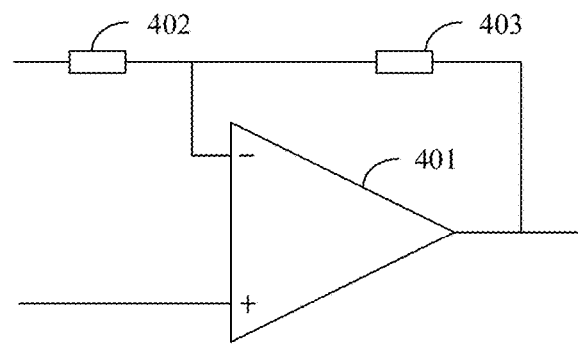
FIG. 4 is a schematic diagram of a noninverting amplifier circuit.

Optionally, in some embodiments, the amplifier circuit may be a noninverting amplifier circuit. For example, FIG. 4 is a schematic diagram of a noninverting amplifier circuit. The noninverting amplifier circuit shown in FIG. 4 includes an operational amplifier 401, a first resistor 402, and a second resistor 403.

Optionally, in some other embodiments, the amplifier circuit may alternatively be an inverting amplifier circuit, a differential amplifier circuit, or the like.

Figure 5:
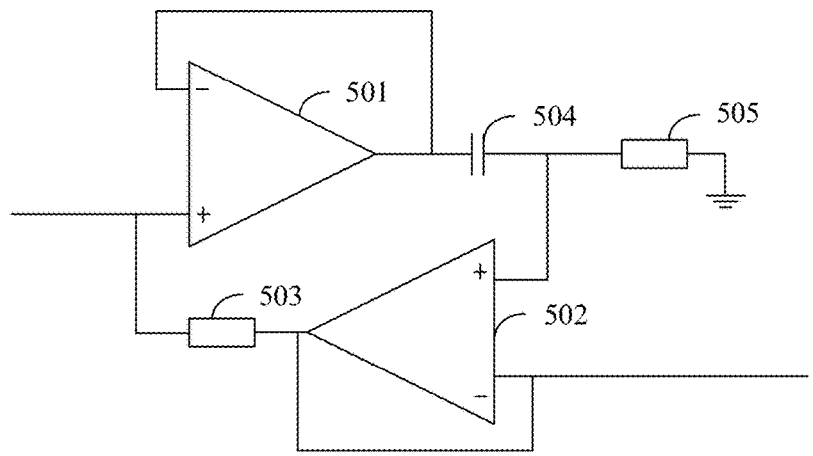
FIG. 5 is a schematic diagram of a low-consumption dual operational amplifier active inductance circuit.

Optionally, in some embodiments, the active inductance circuit may be a low-consumption dual operational amplifier active inductance circuit. For example, FIG. 5 is a schematic diagram of a low-consumption dual operational amplifier active inductance circuit. As shown in FIG. 5, the active inductance circuit includes an operational amplifier 501, an operational amplifier 502, a resistor 503, a capacitor 504, and a resistor 505. Refer to FIG. 5 for a connection relationship between the elements of the active inductance circuit. Details do not need to be described herein.

Figure 6:
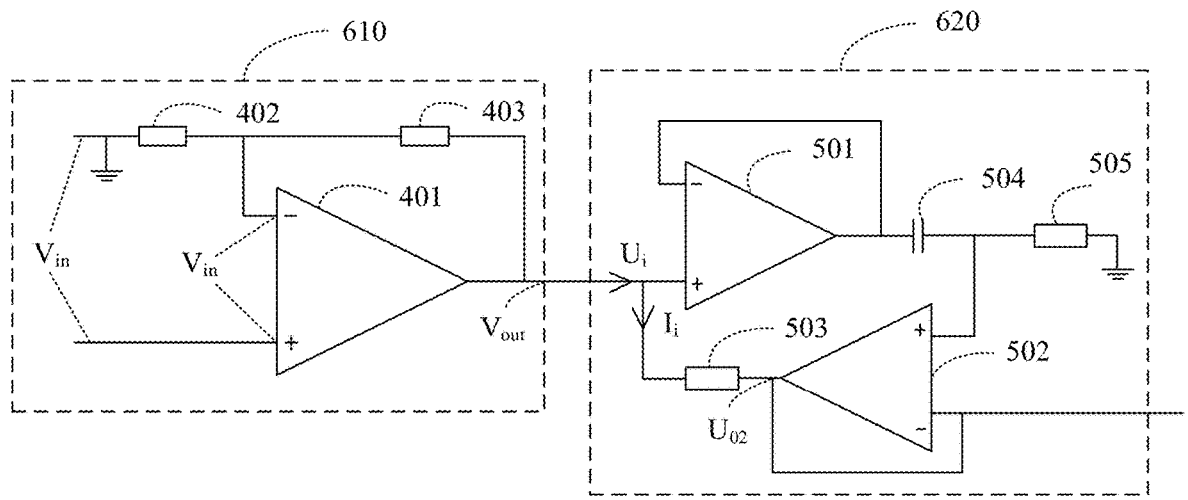
FIG. 6 shows an amplification apparatus including the amplifier circuit shown in FIG. 4 and the active inductance circuit shown in FIG. 5.

The amplifier circuit shown in FIG. 4 and the active inductance circuit shown in FIG. 5 may constitute an amplification apparatus. For example, FIG. 6 shows an amplification apparatus including the amplifier circuit shown in FIG. 4 and the active inductance circuit shown in FIG. 5. The amplifier circuit 610 shown in FIG. 6 is the noninverting amplifier circuit shown in FIG. 4, and the active inductance circuit shown in FIG. 6 is the low-consumption dual operational amplifier active inductance circuit shown in FIG. 5.

Assuming that a resistance value of the first resistor 402 is R1, and a resistance value of the second resistor 403 is R2, an amplification factor $K_1$ of the amplifier circuit shown in FIG. 4 is 1+R2/R1. A voltage output by the amplifier circuit satisfies the following formula:

$$V_{OUT}(S) = (V_{in}(S) + V_{OFF}) \times K_1 \qquad \text{(formula 1)}$$

$V_{out}$ represents an output voltage, $V_{in}$ represents an input voltage of the amplifier circuit, and $V_{off}$ represents a direct current bias current generated by the operational amplifier 401.

An input port of the active inductance circuit has the following relationship:

$$U_i(S)/I_i(S)=R_S+S\times R_0\times R_S\times C \quad \text{(formula 2)}$$

$U_i(S)$ represents a voltage of the input port of the active inductance circuit, $I_i(S)$ represents current of the input port of the active inductance circuit, $R_S$ represents a resistance value of the resistor 503, $R_0$ represents a resistance value of the resistor 505, C represents a capacitance value of the capacitor 504, and S represents a parameter S in Laplace Transform.

If the signal input voltage $U_i(S)$ is an alternating current signal $V_{in}(S)\times K_1$ and $R_S$ is far less than $S\times R_0\times R_S\times C$, $U_{02}(S)=U_i(S)=V_{in}(S)\times K_1$.

If the signal input voltage $U_i(S)$ is a direct current signal $V_{off}\times K_1$, $U_{02}(S)=0$. If a direct current bias $V_{off}'$ generated by the active inductance circuit itself is considered, $U_{02}(S)=V_{off}'$.

A voltage on two ends of the resistor 503 or current flowing through the resistor 503 may be used as an output signal of the amplifier circuit.

The voltage $U_{RS}(S)$ on the two ends of the resistor 503 has the following relationship with $R_0$, $R_S$, and C:

$$U_{RS}(S)=I_i(S)\times R_S=[U_i(S)/(S\times R_0\times R_S\times C)]\times R_S=U_i(S)/(S\times R_0\times C) \quad \text{(formula 3)}$$

$U_{RS}(S)$ represents the voltage on the two ends of the resistor 503, $U_i(S)$ represents the voltage of the input port of the active inductance circuit, $I_i(S)$ represents the current of the input port of the active inductance circuit, $R_S$ represents the resistance value of the resistor 503, $R_0$ represents the resistance value of the resistor 505, C represents the capacitance value of the capacitor 504, and S represents the parameter S in Laplace Transform.

In view of this, integration restoration for a derivative signal can be completed by using the active inductance circuit. Therefore, an integrator configured to perform integration restoration on a derivative signal does not need to be disposed in a subsequent detection apparatus.

Figure 7:
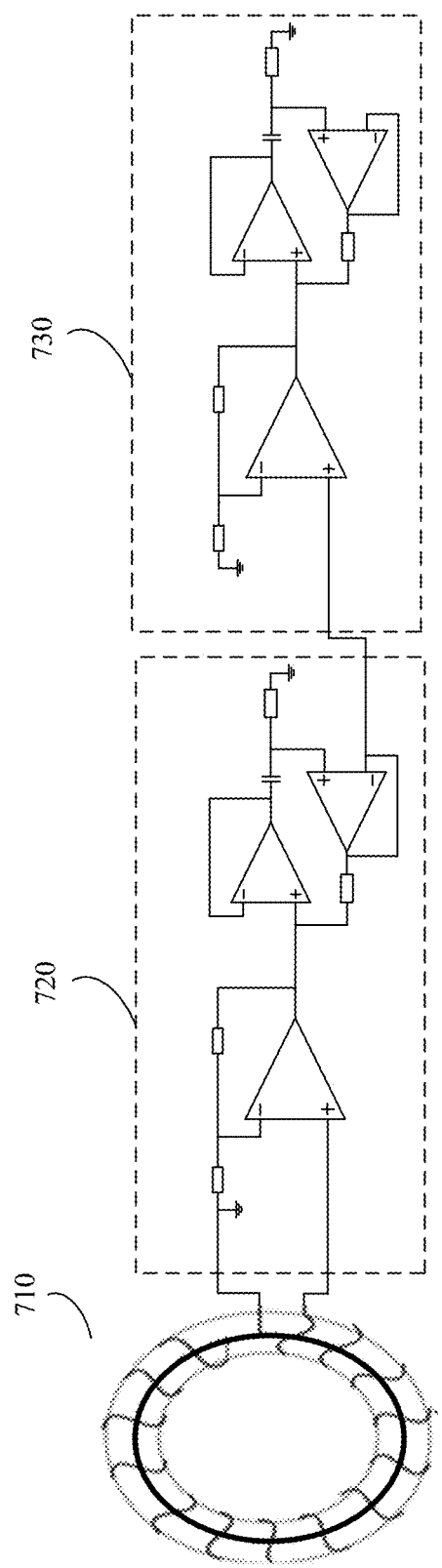
FIG. 7 is a schematic diagram of a connection relationship between two amplification apparatuses shown in FIG. 6 and a Rogowski coil.

FIG. 7 is a schematic diagram of a connection relationship between two amplification apparatuses shown in FIG. 6 and a Rogowski coil.

As shown in FIG. 7, a group of amplification apparatuses connected to the Rogowski coil 710 includes two amplification apparatuses in total, which are respectively an amplification apparatus 720 and an amplification apparatus 730.

Assuming that an output signal of the Rogowski coil 710 is $V_{in}$, an amplification factor of the amplification apparatus 720 is $K_1$, and an amplification factor of the amplification apparatus 730 is $K_2$, an output of the amplification apparatus 730 is $V_{in}\times K_1\times K_2+V_{off}$. $V_{off}$ is a direct current bias signal generated by an active inductance circuit in the amplification apparatus 730.

Figure 8:
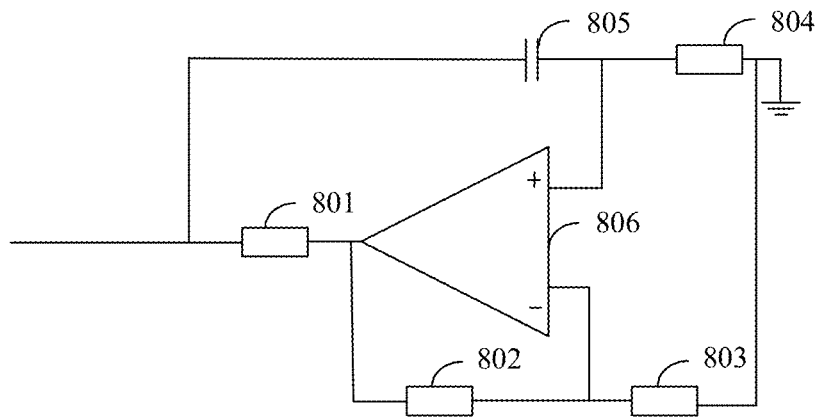
FIG. 8 shows another active inductance circuit.

It may be understood that, similar to an amplifier circuit, in addition to the low-consumption dual operational amplifier active inductance circuit shown in FIG. 5, another type of active inductance circuit may also be used. For example, FIG. 8 shows another active inductance circuit. FIG. 8 shows a single operational amplifier active inductance circuit. The active inductance circuit shown in FIG. 8 includes resistors 801 to 804, a capacitor 805, and an operational amplifier 806. Refer to FIG. 8 for a connection relationship between the elements of the active inductance circuit. Details do not need to be described herein.

Figure 9:
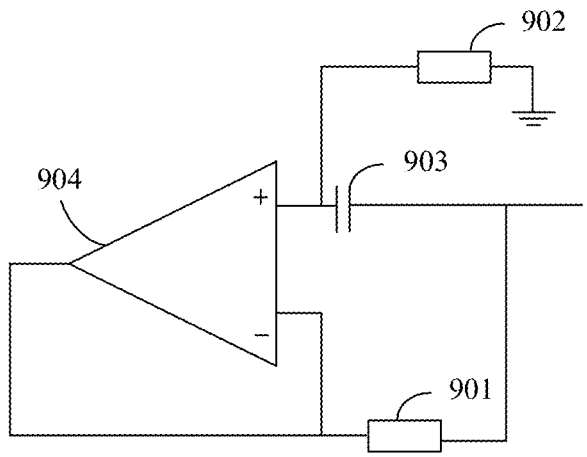
FIG. 9 shows another active inductance circuit.

In another example, FIG. 9 shows another active inductance circuit. FIG. 9 shows a single operational amplifier active inductance circuit. The active inductance circuit shown in FIG. 9 includes resistors 901 to 902, a capacitor 903, and an operational amplifier 904. Refer to FIG. 9 for a connection relationship between the elements of the active inductance circuit. Details do not need to be described herein.

Current can be detected by using the foregoing current detection system. The following further describes a current detection method with reference to FIG. 10. The method shown in FIG. 10 may be performed by a detection apparatus. The detection apparatus is mounted in a target device. The foregoing current detection system is mounted in the target device.

Figure 10:
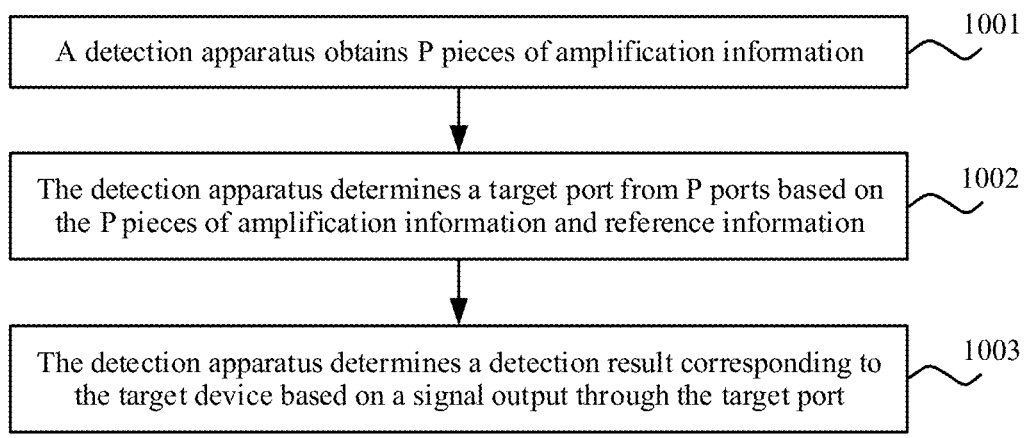
FIG. 10 is a schematic flowchart of a current detection method according to an embodiment of this application.

FIG. 10 is a schematic flowchart of a current detection method according to an embodiment of this application.

1001. A detection apparatus obtains P pieces of amplification information, where the P pieces of amplification information are respectively amplification factors of P amplification apparatuses in the detection apparatus, and P is a positive integer greater than or equal to 2. The P amplification apparatuses are a group of amplification apparatuses in the current detection system.

Optionally, in some embodiments, the P amplification apparatuses may be P first amplification apparatuses. In other words, each of the P amplification apparatuses includes an amplifier circuit and an active inductance circuit.

Optionally, in some other embodiments, the $P^{th}$ amplification apparatus in the P amplification apparatuses (namely, the last amplification apparatus) may be the first amplification apparatus. In other words, only the last amplification apparatus includes the amplifier circuit and the active inductance circuit. Other amplification apparatuses than the $P^{th}$ amplification apparatus in the P amplification apparatuses may include only the amplifier circuit, and do not include the active inductance circuit.

The detection apparatus may determine an amplification factor of an input signal on an output end of each amplification apparatus based on the P pieces of amplification information.

It is assumed that a value of P is 3, and the three amplification apparatuses are sequentially an amplification apparatus 1, an amplification apparatus 2, and an amplification apparatus 3. An amplification factor of the amplification apparatus 1 is $K_1$, an amplification factor of the amplification apparatus 2 is $K_2$, and an amplification factor of the amplification apparatus 3 is $K_3$. Then, a signal $V_{out1}$ obtained after the input signal $V_{in}$ is amplified by the amplification apparatus 1 is $K_1\times V_{in}$, a signal $V_{out2}$ obtained after the input signal $V_{in}$ is amplified by the amplification apparatus 2 is $K_1\times K_2\times V_{in}$, and a signal $V_{out3}$ obtained after the input signal $V_{in}$ is amplified by the amplification apparatus 3 is $K_1\times K_2\times K_3\times V_{in}$. In other words, after passing through the amplification apparatus 1, the input signal $V_{in}$ is amplified by $K_1$ times; after passing through the amplification apparatus 2, the input signal $V_{in}$ is amplified by $K_1\times K_2$ times; and after passing through the amplification apparatus 3, the input signal $V_{in}$ is amplified by $K_1\times K_2\times K_3$ times.

1002. The detection apparatus determines a target port from P ports based on the P pieces of amplification information and reference information, where the P ports one-to-one correspond to the P amplification apparatuses, and the port is configured to output an output signal of the corresponding amplification apparatus.

If the P amplification apparatuses are all the first amplification apparatuses, an output signal of the amplification apparatus is a signal obtained after direct current component suppression processing. In other words, the output signal of the amplification apparatus includes an amplified input signal (the input signal herein is a signal obtained by an input end of the amplification apparatus) and a direct current signal generated by the active inductance circuit in the amplification apparatus.

The reference information may include at least one of the following information: a rated current signal range of the target device, P output signals output through the P ports, and an optimal detection range of the detection apparatus.

Optionally, in some embodiments, the reference information may be the rated current signal range of the target device.

For example, the target device that performs current detection by using the current detection system may be a circuit breaker in a power distribution frame. In this case, the detection apparatus may determine the rated current signal range of the circuit breaker.

In another example, the target device that performs current detection by using the current detection system may be a switch in a weak-current device or a strong-current device. In this case, the detection apparatus may determine the rated current signal range of the switch.

The rated current signal range of the target device may be stored in a memory of the target device. The detection apparatus may read data stored in the memory, to obtain the rated current signal range of the target device. Therefore, the detection apparatus can obtain the rated current signal range of the target device only after being connected to the target device.

Optionally, in some embodiments, the target current signal range may be a current detection range of the detection apparatus. Correspondence between the rated current signal range of the target device and the P amplification factors may be preset and stored in a memory of the detection apparatus.

Different target devices may have different rated current signal ranges. A switch is used as an example. The rated current signal range of some switches may be 10 A to 20 A, the rated current signal range of some switches may be 100 A to 200 A, and the rated current signal range of some switches may be 5 A to 10 A. The detection apparatus may automatically select a proper amplification apparatus as a target amplification apparatus based on the rated current signal range of the target device.

For example, still assuming that P is 3, and the amplification factors of the three amplification apparatuses are all 10, after passing through the amplification apparatus 1, the input signal is amplified by 10 times; after passing through the amplification apparatus 2, the input signal is amplified by 100 times; and after passing through the amplification apparatus 3, the input signal is amplified by 1000 times. The input signal herein is a signal obtained by an input end of the amplification apparatus 1. It is assumed that a port 1 is a port of the amplification apparatus 1 for connecting to the detection apparatus, a port 2 is a port of the amplification apparatus 2 for connecting to the detection apparatus, and a port 3 is a port of the amplification apparatus 3 for connecting to the detection apparatus. In this case, a signal output through the port 1 is the input signal amplified by 10 times, a signal output through the port 2 is the input signal amplified by 100 times, and a signal output through the port 3 is the input signal amplified by 1000 times. It is assumed that the rated current signal range of the target device connected to the detection apparatus is 15 A to 20 A. In this case, the detection apparatus may select the port 2 as the target port. In other words, the detection apparatus may obtain the signal output through the port 2. It is assumed that the rated current signal range of the target device connected to the detection apparatus is 150 A to 250 A. In this case, the detection apparatus may select the port 1 as the target port. In other words, the detection apparatus may obtain the signal output through the port 1. It is assumed that the rated current signal range of the target device connected to the detection apparatus is 1.50 A to 2.50 A. In this case, the detection apparatus may select the port 3 as the target port. In other words, the detection apparatus may obtain the signal output through the port 3.

Different detection apparatuses may have different optimal detection ranges. Therefore, in some embodiments, the detection apparatus may alternatively select the target port based on the optimal detection range of the detection apparatus itself. The optimal detection range means that an error between a detection result obtained by the detection apparatus in the detection range and an actual result is minimum. Different detection apparatuses may have different detection ranges. Therefore, in some other embodiments, the detection apparatus may alternatively determine the target port based on the detection range of the detection apparatus.

The optimal detection range is used as an example, and the following describes how the detection apparatus determines the target port.

Correspondence between the optimal detection range and the P amplification factors may be preset and stored in the memory of the detection apparatus.

For example, still assuming that P is 3, and the amplification factors of the three amplification apparatuses are all 10, after passing through the amplification apparatus 1, the input signal is amplified by 10 times; after passing through the amplification apparatus 2, the input signal is amplified by 100 times; and after passing through the amplification apparatus 3, the input signal is amplified by 1000 times. The input signal herein is the signal obtained by the input end of the amplification apparatus 1. It is assumed that the port 1 is the port of the amplification apparatus 1 for connecting to the detection apparatus, the port 2 is the port of the amplification apparatus 2 for connecting to the detection apparatus, and the port 3 is the port of the amplification apparatus 3 for connecting to the detection apparatus. In this case, the signal output through the port 1 is the input signal amplified by 10 times, the signal output through the port 2 is the input signal amplified by 100 times, and the signal output through the port 3 is the input signal amplified by 1000 times. It is assumed that the optimal detection range of the detection apparatus is 800 mV to 1200 mV. In this case, the detection apparatus may select the port 2 as the target port. In other words, the detection apparatus may obtain the signal output through the port 2. It is assumed that the optimal detection range of the detection apparatus is 8 V to 12 V. In this case, the detection apparatus may select the port 3 as the target port. In other words, the detection apparatus may obtain the signal output through the port 3. It is assumed that the optimal detection range of the detection apparatus is 80 mV to 120 mV. In this case, the detection apparatus may select the port 1 as the target port. In other words, the detection apparatus may obtain the signal output through the port 1.

Optionally, in some other embodiments, the detection apparatus may alternatively select the target port based on any two or all of the rated current signal range of the target device, the P output signals output through the P ports, and the optimal detection range of the detection apparatus.

The P output signals output through the P ports and the optimal detection range of the detection apparatus are used as an example. The detection apparatus may determine the target port based on the P output signals output through the P ports and the optimal detection range of the detection apparatus.

For example, still assuming that P is 3, and the amplification factors of the three amplification apparatuses are all 10, after passing through the amplification apparatus 1, the input signal is amplified by 10 times; after passing through the amplification apparatus 2, the input signal is amplified by 100 times; and after passing through the amplification apparatus 3, the input signal is amplified by 1000 times. The input signal herein is the signal obtained by the input end of the amplification apparatus 1. It is assumed that the port 1 is the port of the amplification apparatus 1 for connecting to the detection apparatus, the port 2 is the port of the amplification apparatus 2 for connecting to the detection apparatus, and the port 3 is the port of the amplification apparatus 3 for connecting to the detection apparatus. In this case, the signal output through the port 1 is the input signal amplified by 10 times, the signal output through the port 2 is the input signal amplified by 100 times, and the signal output through the port 3 is the input signal amplified by 1000 times. It is assumed that magnitudes of the signals output through the three output ports are respectively 1 mV, 10 mV, and 100 mV, and the optimal detection range of the detection apparatus is 10 mV. In this case, the detection apparatus may select the port 2 as the target port. In other words, the detection apparatus may obtain the signal output through the port 2. It is assumed that magnitudes of the signals output through the three output ports are respectively 10 mV, 100 mV, and 1000 mV, and the optimal detection range of the detection apparatus is 10 mV. In this case, the detection apparatus may select the port 1 as the target port. In other words, the detection apparatus may obtain the signal output through the port 1. It is assumed that magnitudes of the signals output through the three output ports are respectively 0.1 mV, 1 mV, and 10 mV, and the optimal detection range of the detection apparatus is 10 mV. In this case, the detection apparatus may select the port 3 as the target port. In other words, the detection apparatus may obtain the signal output through the port 3.

A rated current signal of the target device and the optimal detection range of the detection apparatus are used as an example. The detection apparatus may determine the target port based on the rated current signal of the target device and the optimal detection range of the detection apparatus.

For example, still assuming that P is 3, and the amplification factors of the three amplification apparatuses are all 10, after passing through the amplification apparatus 1, the input signal is amplified by 10 times; after passing through the amplification apparatus 2, the input signal is amplified by 100 times; and after passing through the amplification apparatus 3, the input signal is amplified by 1000 times. The input signal herein is the signal obtained by the input end of the amplification apparatus 1. It is assumed that the port 1 is the port of the amplification apparatus 1 for connecting to the detection apparatus, the port 2 is the port of the amplification apparatus 2 for connecting to the detection apparatus, and the port 3 is the port of the amplification apparatus 3 for connecting to the detection apparatus. In this case, the signal output through the port 1 is the input signal amplified by 10 times, the signal output through the port 2 is the input signal amplified by 100 times, and the signal output through the port 3 is the input signal amplified by 1000 times. It is assumed that the rated current signal of the target device is 100 A, and the optimal detection range of the detection apparatus is 100 mV. In this case, the detection apparatus may select the port 2 as the target port. In other words, the detection apparatus may obtain the signal output through the port 2. It is assumed that the rated current signal of the target device is 1000 A, and the optimal detection range of the detection apparatus is 100 mV. In this case, the detection apparatus may select the port 1 as the target port. In other words, the detection apparatus may obtain the signal output through the port 1. It is assumed that the rated current signal of the target device is 10 A, and the optimal detection range of the detection apparatus is 100 mV. In this case, the detection apparatus may select the port 3 as the target port. In other words, the detection apparatus may obtain the signal output through the port 3.

Similarly, the detection apparatus may alternatively select the target port based on the P output signals output through the P ports. The detection apparatus may alternatively select the target port based on the rated current signal range of the target device and the P output signals output through the P ports. The detection apparatus may alternatively select the target port based on the rated current signal range of the target device, the P output signals output through the P ports, and the optimal detection range of the detection apparatus. A person skilled in the art may derive a specific determining method based on content disclosed in this application. To avoid redundancy, determining methods are not listed one by one herein.

1003. The detection apparatus determines a detection result corresponding to the target device based on a signal output through the target port.

Optionally, in some embodiments, the signal output through the target port is a detection result corresponding to the target device.

Optionally, in some other embodiments, before that the detection apparatus determines a detection result corresponding to the target device based on a signal output through the target port, the detection apparatus may further obtain detection related information. The detection related information includes at least one of specification information of a printed circuit board in the current detection system, information about Rogowski coils in the current detection system, temperature drift information of operational amplifiers in the P amplification apparatuses, and temperature information of the printed circuit board. The detection related information may affect precision of the detection result. Therefore, the detection apparatus may adjust, based on the detection related information, the obtained signal output by the target amplification apparatus, to obtain the detection signal. In other words, the detection apparatus may adjust, based on the detection related information, the signal output through the target port, to obtain the detection result corresponding to the target device. A storage apparatus may be disposed. The storage apparatus may store temperature drift information of the operational amplifiers in the P amplification apparatuses. The P pieces of amplification information of the P amplification apparatuses may also be stored in the storage apparatus. The storage apparatus may be located in the detection apparatus, or in the printed circuit board. In other words, the detection apparatus may obtain the P pieces of amplification information, the specification information of the printed circuit board, and the temperature drift information of the operational amplifiers in the P amplification apparatuses by reading data in the storage apparatus. The temperature information of the printed circuit board may be obtained by using a temperature sensor disposed in the printed circuit board. In other words, the temperature sensor may be disposed on the printed circuit board. The temperature sensor is configured to: detect a temperature of the printed circuit board, and send the detected temperature of the printed circuit board to the detection apparatus. The temperature sensor may actively send the detected temperature of the printed circuit board to the detection apparatus, or may send the detected temperature to the detection apparatus after receiving request information sent by the detection apparatus.

The specification information of the printed circuit board may include a basic size of the printed circuit board, for example, a length, a width, and a thickness of the printed circuit board. The basic size herein is a size set during design of the printed circuit board. The specification information may further include an actual size of the printed circuit board. The actual size herein is a size that is obtained by actual measurement after the printed circuit board is processed. The specification information may further include a size tolerance of the printed circuit board.

The information about the Rogowski coil may include a self-inductance value, a theoretical mutual inductance value, and the like of the Rogowski coil.

Optionally, in some embodiments, the detection apparatus may further send size information to an upper-layer management system, where the size information is used to indicate a size of the printed circuit board. The size indicated by the size information may be a basic size or an actual size. Apparatuses mounted with current detection systems (for example, a switch and a circuit breaker) vary in size. Sizes of printed circuit boards and Rogowski coils of the current detection systems mounted in the apparatuses that vary in size are also different.

A power distribution frame is used as an example, and the current detection system may be mounted to a circuit breaker in the power distribution frame. The power distribution frame may include a plurality of plug-in frames in which circuit breakers can be mounted. These plug-in frames not only can be used to mount a circuit breaker of a first size, but also can be used to mount a circuit breaker of a second size. The first size is different from the second size. For example, one plug-in frame may be used to mount one circuit breaker of the first size, or may be used to mount two circuit breakers of the second size. The size of the circuit breaker corresponds to the size of the current detection system. The current detection system of a first size is mounted into the circuit breaker of the first size, and the current detection system of a second size is mounted into the current detection system of the second size. By using size information reported by the detection apparatus, the upper-layer management system may determine the size of the circuit breaker actually mounted in the plug-in frame.

For example, it is assumed that the power distribution frame includes two plug-in frames in total, which are respectively a first plug-in frame and a second plug-in frame. Two circuit breakers each provided with the current detection system and the detection apparatus are mounted in the first plug-in frame, and one circuit breaker provided with the current detection system and the detection apparatus is mounted in the second plug-in frame. Communication addresses of the two plug-in frames are different. The upper-layer management system may determine, based on size information from different communication addresses, the size and quantity of circuit breakers mounted in each plug-in frame, to determine mounting positions of circuit breakers of different models. The upper-layer management system automatically generates an interface display diagram matching reality.

Figure 15:
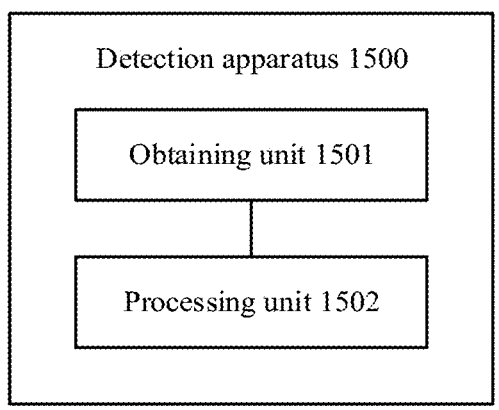
FIG. 15 shows a detection apparatus according to an embodiment of this application.

FIG. 15 shows a detection apparatus according to an embodiment of this application. As shown in FIG. 15, the detection apparatus 1500 includes an obtaining unit 1501 and a processing unit 1502.

The obtaining unit 1501 is configured to obtain P pieces of amplification information, where the P pieces of amplification information are respectively amplification factors of P amplification apparatuses, P is a positive integer greater than or equal to 2, the detection apparatus is mounted in a target device, the current detection system according to any one of claims 1 to 8 is mounted in the target device, and the P amplification apparatuses are a group of amplification apparatuses in the current detection system.

The processing unit 1502 is configured to determine a target port from P ports based on the P pieces of amplification information and reference information, where the P ports one-to-one correspond to the P amplification apparatuses, and the port is configured to output an output signal of the corresponding amplification apparatus.

The processing unit 1502 is further configured to determine a detection result corresponding to the target device based on a signal output through the target port.

The obtaining unit 1501 and the processing unit 1502 may be implemented by a processor. For specific functions and beneficial effects of the obtaining unit 1501 and the processing unit 1502, refer to the method shown in FIG. 10. Details do not need to be described herein.

In a possible embodiment, the embodiments of this application further provide a detection apparatus. The detection apparatus may include a processor, and optionally, may further include a transceiver and a memory. The processor may be configured to implement corresponding functions and operations of the foregoing processing module. The memory may be configured to store execution instructions or application code, and the processor controls execution, to implement the current detection method provided in the foregoing embodiments; and/or may also be configured to temporarily store some data, instruction information, and the like. The memory may exist independently of the processor. In this case, the memory may be connected to the processor through a communications line. In another possible design, the memory may alternatively be integrated with the processor. This is not limited in this embodiment of this application.

In the embodiments of this application, a processor having a processing function may be considered as a processing unit. The processing unit may also be referred to as a processor, a processing single board, a processing module, a processing apparatus, or the like. The method disclosed in the foregoing embodiments of the present invention may be applied to a processor, or implemented by a processor. The processor may be an integrated circuit chip and has a signal processing capability. In an implementation process, steps in the foregoing methods can be implemented by using a hardware integrated logical circuit in the processor, or by using instructions in a form of software.

The foregoing processor in the embodiments of this application may be a general purpose processor, a digital signal processor (DSP), an application-specific integrated circuit (ASIC), a field programmable gate array (FPGA) or another programmable logic device, a discrete gate or transistor logic device, or a discrete hardware component. It may implement or perform the methods, the steps, and logical block diagrams that are disclosed in the embodiments of the present invention. The general purpose processor may be a microprocessor, or the processor may be any conventional processor or the like. Steps of the methods disclosed with reference to the embodiments of the present invention may be directly executed and accomplished by using a hardware decoding processor, or may be executed and accomplished by using a combination of hardware and software modules in the decoding processor. A software module may be located in a mature storage medium in the art, such as a random access memory (RAM), a flash memory, a read-only memory (ROM), a programmable read-only memory, an electrically erasable programmable memory, a register, or the like. The storage medium is located in the memory, and a processor reads instructions in the memory and completes the steps in the foregoing methods in combination with hardware of the processor.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of this application. The foregoing storage medium includes any medium that can store program code, such as a read-only memory (ROM), a random access memory (RAM).

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A current detection system comprising:
a printed circuit board, wherein N Rogowski coils are mounted on the printed circuit board;
N groups of amplification apparatuses, wherein each of the N groups of amplification apparatuses comprises at least one amplification apparatus, and N is a positive integer greater than or equal to 1;
wherein the $n^{th}$ Rogowski coil in the N Rogowski coils is capable of being mounted concentric with the $n^{th}$ current-carrying conductor in N current-carrying conductors, and the $n^{th}$ current-carrying conductor is perpendicular to a plane of the $n^{th}$ Rogowski coil, n=1, . . . , N;
wherein an output end of the $n^{th}$ Rogowski coil is connected to an input end of a first amplification apparatus in the $n^{th}$ group of amplification apparatuses in the N groups of amplification apparatuses;
wherein the first amplification apparatus comprises an amplifier circuit and an active inductance circuit, and an output end of the amplifier circuit is connected to an input end of the active inductance circuit;
wherein the amplifier circuit is configured to:
amplify an obtained input signal, and output a first output signal, the first output signal comprises a first direct current signal and an amplified input signal, the first direct current signal is a direct current signal generated by the amplifier circuit, the input signal comprises an alternating current signal, and the amplified input signal comprises an amplified alternating current signal; and
the active inductance circuit is configured to: obtain the first output signal, perform direct current component suppression processing on the first output signal, and output a second output signal, wherein the second output signal comprises a second direct current signal and an amplified alternating current signal, the second direct current signal is a direct current signal generated by the active inductance current, and the second direct current signal is weaker than the first direct current signal.

2. The current detection system according to claim 1, wherein the $n^{th}$ Rogowski coil is configured to:
detect current in the $n^{th}$ current-carrying conductor, and output a detection signal to the first amplification apparatus in the $n^{th}$ group of amplification apparatuses through the output end of the $n^{th}$ Rogowski coil; and
the $n^{th}$ group of amplification apparatus is configured to amplify the detection signal obtained by the first amplification apparatus in the $n^{th}$ group of amplification apparatus.

3. The current detection system according to claim 1, wherein the amplifier circuit is a noninverting amplifier circuit.

4. The current detection system according to claim 1, wherein the active inductance circuit is a low-consumption dual operational amplifier active inductance circuit.

5. The current detection system according to claim 1, wherein at least one amplification apparatus in the $n^{th}$ group of amplification apparatus is the first amplification apparatus.

6. A current detection method comprising:
obtaining, by a detection apparatus, P pieces of amplification information, wherein the P pieces of amplification information are respectively amplification factors of P amplification apparatuses, P is a positive integer greater than or equal to 2, the detection apparatus is mounted in a target device, a current detection system is mounted in the target device, and the P amplification apparatuses are a group of amplification apparatuses in the current detection system;
determining, by the detection apparatus, a target port from P ports based on the P pieces of amplification information and reference information, wherein the P ports one-to-one correspond to the P amplification apparatuses, and the port is configured to output an output signal of the corresponding amplification apparatus;
determining, by the detection apparatus, a detection result corresponding to the target device based on a signal output through the target port; and
wherein the current detection system comprises:
a printed circuit board, wherein N Rogowski coils are mounted on the printed circuit board;
N groups of amplification apparatuses, wherein each of the N groups of amplification apparatuses comprises at least one amplification apparatus, and N is a positive integer greater than or equal to 1;
wherein the $n^{th}$ Rogowski coil in the N Rogowski coils is capable of being mounted concentric with the $n^{th}$ current-carrying conductor in N current-carrying conductors, and the $n^{th}$ current-carrying conductor is perpendicular to a plane of the $n^{th}$ Rogowski coil, n=1, ..., N;
wherein an output end of the $n^{th}$ Rogowski coil is connected to an input end of a first amplification apparatus in the $n^{th}$ group of amplification apparatuses in the N groups of amplification apparatuses;
wherein the first amplification apparatus comprises an amplifier circuit and an active inductance circuit, and an output end of the amplifier circuit is connected to an input end of the active inductance circuit;
wherein the amplifier circuit is configured to:
amplify an obtained input signal, and output a first output signal, the first output signal comprises a first direct current signal and an amplified input signal, the first direct current signal is a direct current signal generated by the amplifier circuit, the input signal comprises an alternating current signal, and the amplified input signal comprises an amplified alternating current signal; and
the active inductance circuit is configured to: obtain the first output signal, perform direct current component suppression processing on the first output signal, and output a second output signal, wherein the second output signal comprises a second direct current signal and an amplified alternating current signal, the second direct current signal is a direct current signal generated by the active inductance current, and the second direct current signal is weaker than the first direct current signal.

7. The method according to claim 6, wherein before determining the detection result corresponding to the target device based on the signal output through the target port, the method further comprises:
obtaining, by the detection apparatus, detection related information, wherein the detection related information comprises at least one of specification information of a printed circuit board in the current detection system, information about Rogowski coils in the current detection system, temperature drift information of operational amplifiers in the P amplification apparatuses, and temperature information of the printed circuit board; and
wherein determining the detection result corresponding to the target device based on the signal output through the target port comprises:
adjusting, by the detection apparatus based on the detection related information, the signal output through the target port, and determining the detection result corresponding to the target device.

8. The method according to claim 7, further comprising:
sending, by the detection apparatus, size information to an upper-layer management system, wherein the specification information indicates a size of the printed circuit board in the current detection system.

9. The method according to claim 6, wherein the reference information comprises at least one of the following information: a rated current signal range of the target device, P output signals output through the P ports, and an optimal detection range of the detection apparatus.

10. A detection apparatus comprising:
a processor; and
a memory coupled to the processor and having processor-executable instructions stored thereon which when executed by the processor cause the detection apparatus to:
obtain P pieces of amplification information, wherein the P pieces of amplification information are respectively amplification factors of P amplification apparatuses, P is a positive integer greater than or equal to 2, the detection apparatus is mounted in a target device, a current detection system is mounted in the target device, and the P amplification apparatuses are a group of amplification apparatuses in the current detection system;
determine a target port from P ports based on the P pieces of amplification information and reference information, wherein the P ports one-to-one correspond to the P amplification apparatuses, and the port is configured to output an output signal of the corresponding amplification apparatus;
determine a detection result corresponding to the target device based on a signal output through the target port; and
wherein the current detection system comprises:
a printed circuit board, wherein N Rogowski coils are mounted on the printed circuit board;
N groups of amplification apparatuses, wherein each of the N groups of amplification apparatuses comprises at least one amplification apparatus, and N is a positive integer greater than or equal to 1;
wherein the $n^{th}$ Rogowski coil in the N Rogowski coils is capable of being mounted concentric with the $n^{th}$ current-carrying conductor in N current-carrying conductors, and the $n^{th}$ current-carrying conductor is perpendicular to a plane of the $n^{th}$ Rogowski coil, n=1, N;

wherein an output end of the n$^{th}$ Rogowski coil is connected to an input end of a first amplification apparatus in the n$^{th}$ group of amplification apparatuses in the N groups of amplification apparatuses;

wherein the first amplification apparatus comprises an amplifier circuit and an active inductance circuit, and an output end of the amplifier circuit is connected to an input end of the active inductance circuit;

wherein the amplifier circuit is configured to:

amplify an obtained input signal, and output a first output signal, the first output signal comprises a first direct current signal and an amplified input signal, the first direct current signal is a direct current signal generated by the amplifier circuit, the input signal comprises an alternating current signal, and the amplified input signal comprises an amplified alternating current signal; and the active inductance circuit is configured to: obtain the first output signal, perform direct current component suppression processing on the first output signal, and output a second output signal, wherein the second output signal comprises a second direct current signal and an amplified alternating current signal, the second direct current signal is a direct current signal generated by the active inductance current, and the second direct current signal is weaker than the first direct current signal.

11. The detection apparatus according to claim 10, wherein the instructions further cause the detection apparatus to:

obtain detection related information, wherein the detection related information comprises at least one of specification information of a printed circuit board in the current detection system, information about Rogowski coils in the current detection system, temperature drift information of operational amplifiers in the P amplification apparatuses, and temperature information of the printed circuit board; and adjust, based on the detection related information, the signal output through the target port, and determine the detection result corresponding to the target device.

12. The detection apparatus according to claim 10, wherein the reference information comprises at least one of the following information: a rated current signal range of the target device, P output signals output through the P ports, and an optimal detection range of the detection apparatus.

13. The detection apparatus according to claim 10, wherein the instructions further cause the detection apparatus to send size information to an upper-layer management system, and the specification information indicates a size of the printed circuit board in the current detection system.

* * * * *

UNITED STATES PATENT AND TRADEMARK OFFICE
CERTIFICATE OF CORRECTION

PATENT NO. : 11,933,820 B2
APPLICATION NO. : 17/359190
DATED : March 19, 2024
INVENTOR(S) : Wu et al.

It is certified that error appears in the above-identified patent and that said Letters Patent is hereby corrected as shown below:

In the Claims

Claim 10: Column 24, Line 67: "n=1, N;" should read -- n=1, ..., N; --.

Signed and Sealed this
Twenty-sixth Day of November, 2024

Katherine Kelly Vidal
*Director of the United States Patent and Trademark Office*